United States Patent
Arevalo

[11] Patent Number: 6,104,986
[45] Date of Patent: Aug. 15, 2000

[54] CONTINUOUSLY VARIABLE CONSTANT-ATTENUATION PHASE SHIFTER

[75] Inventor: Augusto Arevalo, Miami, Fla.

[73] Assignee: AmerAmp, LC, Carlsbad, Calif.

[21] Appl. No.: 09/053,971

[22] Filed: Apr. 2, 1998

[51] Int. Cl.[7] .................................... G01R 31/28
[52] U.S. Cl. ............... 702/120; 702/66; 702/68; 702/106; 714/724
[58] Field of Search .................... 702/120, 121, 702/122, 137, 117, 106, 68, 66, 72, 73, 75; 341/144; 714/724

Primary Examiner—Marc S. Hoff
Assistant Examiner—Hien Vo
Attorney, Agent, or Firm—Gray Cary Ware Freidenrich

[57] ABSTRACT

A method and apparatus for a phase shifter includes a controller controlling a voltage controlled phase shifting circuit for shifting the phase of a high frequency input signal. The phase shifting circuit includes microstrip elements arranged in a 3 dB hybrid structure, and also includes first and second reverse-biased diodes electrically connected to the microstrip elements and operating as varactors. The controller drives a D/A converter to control the bias voltage of the phase shifting circuit and thereby to adjust the phase shift of a high frequency output signal relative to the high frequency input signal.

8 Claims, 5 Drawing Sheets

CONTINUOUSLY VARIABLE CONSTANT-ATTENUATION PHASE SHIFTER

CROSS REFERENCE TO RELATED APPLICATION

Not applicable

BACKGROUND OF THE INVENTION

1. Field of the Invention

The invention disclosed broadly relates to phase shifting, and more particularly relates to constant-attenuation continuously variable phase shifters and methods of optimizing their performance.

2. Description of the Related Art

Typical phase shifters comprise a digital input and the device is capable of a fixed number of discrete phase delays. An 8-bit device can therefore produce 256 different discrete phase delays by means of switching on and off, as required, transmission lines of fixed lengths. Assuming that these phase delays are evenly distributed throughout 180 degrees, as is common, then the phase shifter would have a resolution of 0.7 degrees (180 degrees/256). Even if a device with a greater number of bits is used, it is always possible that a circuit designer will need a phase shifter with a greater, or even continuous, resolution, either for smaller desired changes in phase or for achieving certain specific values of phase delay.

Another disadvantage of typical phase shifters, and therefore of typical phase shifter and amplitude controller pairs ("phase/amplitude controllers"), is that neither variable is independent of the other. Changes in phase produce changes in amplitude (attenuation), and changes in amplitude also produce changes in phase. The fact that both variables are changing at the same time makes it difficult to set the system or circuit to particular values of phase and amplitude, and it also makes the optimization of a system or circuit more complex.

The optimization of a typical phase/amplitude controller can be a lengthy process. It can require the search of every phase and amplitude combination, changing one variable at a time, and the comparison of the results for each of these combinations. Further, even if the circuit is initially optimized, a change in environmental conditions like temperature, pressure, humidity, etc., will move the optimization point. This causes a deterioration in the performance of the circuit unless, or until, the phase/amplitude controller is reoptimized. Such reoptimization can be difficult and can itself cause a deterioration in performance because the new optimization point for the phase/amplitude controller cannot be searched for off-line. The phase/amplitude controller must actually be set to each of the different phase and amplitude values (many of which produce poor performance) on-line without noticeably disturbing the operation of the circuit, and the performance of the circuit for each set of values must be measured.

Accordingly, there is a need for a phase shifter and a phase/amplitude controller, and methods of initially optimizing and subsequently updating them, which overcome these problems.

SUMMARY OF THE INVENTION

Briefly, in accordance with one aspect of the invention, there is provided a first method for selecting an optimal-value for an input to a device in a circuit, and for setting the input to the optimal-value, the first method essentially comprising the successive narrowing or dividing, logarithmically, of an input range based on the performance of the circuit at test points chosen from the input range.

Briefly, in accordance with another aspect of the invention, there is provided a second method for selecting an optimal-value for an input to a device in a circuit, wherein the input is currently set to a starting-value, and for setting the input to the optimal-value, the second method essentially comprising moving the input value based on the performance of the circuit at input values in the vicinity of the starting-value.

Both methods can be implemented as a computer readable medium such as a diskette, CD ROM, or transmitted waveform, containing program instructions comprising instructions for each of the steps in the methods.

Briefly, in accordance with another aspect of the invention, there is provided a phase shifting device for shifting the phase of an input signal, the phase shifting device comprising a microstrip element arranged in a 3 dB hybrid structure; a first circuit element having continuously variable capacitance, and which is coupled to port 3 of the 3 dB hybrid structure; a second circuit element having continuously variable capacitance, and which is coupled to port 4 of the 3 dB hybrid structure; and means for controlling the phase shift.

DETAILED DESCRIPTION OF AN EMBODIMENT

Figure 1:
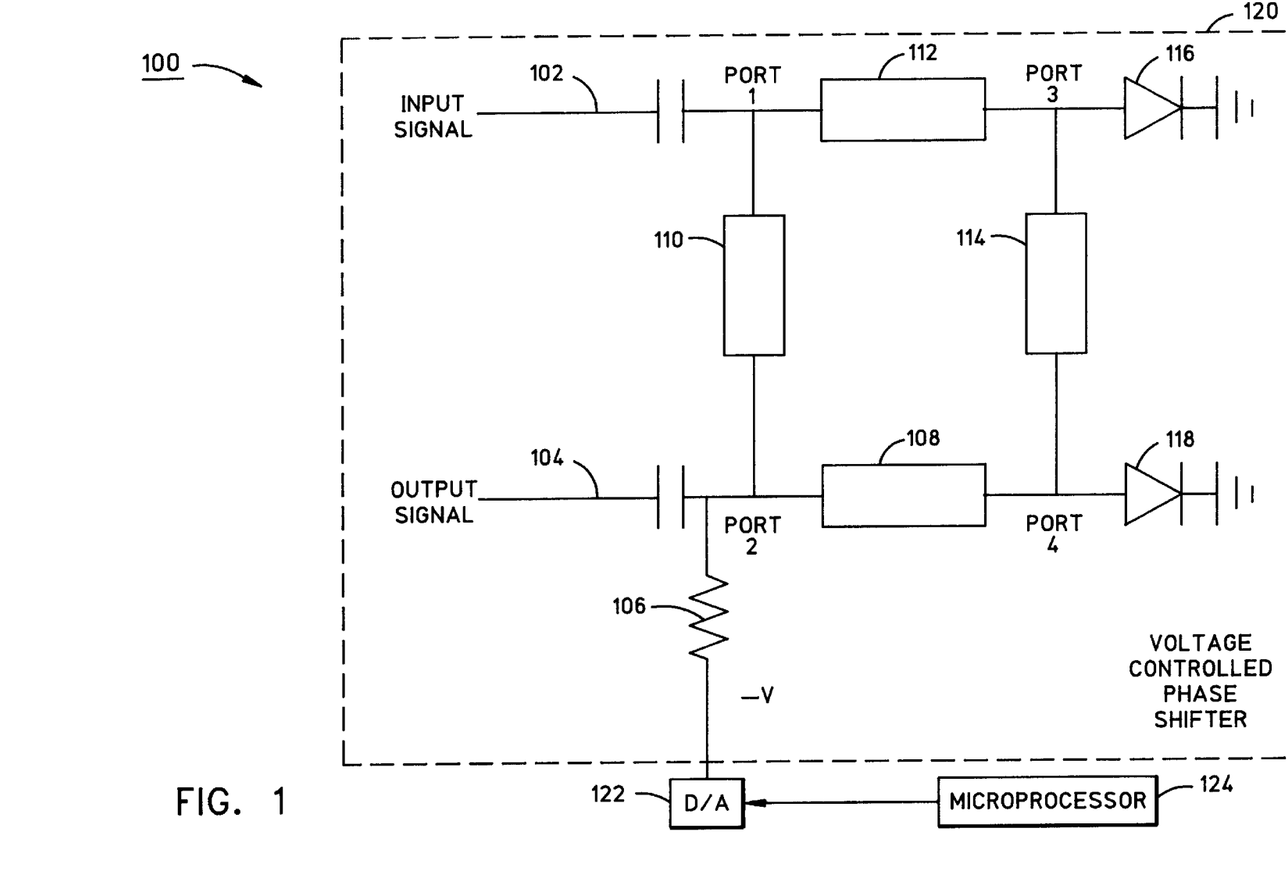
FIG. 1 is a diagram of a phase shifter according to the present invention.

Referring to FIG. 1, there is shown a phase shifting circuit 100 in accordance with the present invention. The microprocessor 124 and the digital-to-analog ("D/A") converter 122 are intended to be generic because there are no special requirements for these functions. The voltage controlled phase shifter (the "phase shifter") 120, however, has several features, each of which will be given a more detailed explanation, after a preliminary overview of the structure and operation.

First, the phase shifter is constructed in a typical 3 dB hybrid structure, with microstrip elements 108, 110, 112, 114 in each of the four legs. The four ports of a typical 3 dB hybrid are shown in FIG. 1. Second, the two diodes 116, 118 are operated in a reverse-biased mode to provide a variable capacitance, and therefore a variable phase delay. The bias level, and phase delay, is controlled through the microprocessor 124, the D/A converter 122, and the resistor 106. Third, the capacitors 102, 104, together with the reverse-biased diodes 116, 118, provide direct current ("DC") decoupling of the phase shifter 120 from the input signal and the output signal, which enables the circuit to control the biasing voltage level across the diodes 116, 118.

The microstrip elements 108, 110, 112, 114 of the 3 dB hybrid structure have widths that correspond to the desired impedance of each leg, and have lengths that correspond to ¼ of the wavelength of the primary frequency of the input signal. Note that in practice the microstrip elements 108, 110, 112, 114 would be one continuous microstrip element, although the four legs need not have the same widths and lengths. The use of microstrip allows for ease in manufacturing because microstrips and stripline structures are photographically repeatable printed circuit board artwork, and their basic response is determined by their dimensions. Other types of transmission lines besides microstrip may also be employed.

When diodes are operated in reverse-biased mode they exhibit a capacitance which varies with the magnitude of the applied voltage. The diodes 116, 118 therefore operate as varactors, and the continuously variable capacitance produces a continuously variable phase delay. In alternate embodiments, other circuit elements that produce a variable phase delay could also be used. The capacitors 102, 104 provide DC decoupling, which allows the voltage level across the diodes 116, 118 to be controlled by an external device. In FIG. 1, the microprocessor 124 and the D/A 122 are used to control the voltage level, and therefore the phase shift.

The diodes 116, 118 are short-circuited to ground, as shown in FIG. 1, in order to provide a "wall" that will reflect the input signal without unnecessary signal loss. Alternate implementations of a wall exist, two of the most common being to use an open-circuit instead of a short-circuit, or to use a ¼-wave low-impedance stub. It is important that the reflected signals from the two short-circuits to ground (ports 3 and 4) cancel at the input (port 1) and be in phase at the output (port 2), otherwise the loss of the resulting output signal will vary across the phase range of the phase shifter 120 because of the mismatched reflections. In order to be utilized, then, for constant-attenuation phase shifting, the two diodes 116, 118 must have substantially the same capacitance change characteristics (and therefore phase delay), as a function of reverse biasing voltage, over a sufficiently large range to provide the required phase shifts. This can be achieved if the diodes 116, 118 are taken from the same wafer lot or if a double diode package is used.

The relationship between the biasing voltage level and the phase delay enables the phase shifter 120 to have a continuously variable phase delay. Most applications, however, do not require a continuously variable phase, but only need a phase step size that is small enough to meet their requirements. The embodiment of FIG. 1 is still preferable for these applications because it can be used for all of them. Any resolution (phase step size) can be achieved by appropriately selecting the D/A converter 122. As an example, while an 8 bit D/A converter only produces a resolution of 0.7 degrees, a 12-bit D/A converter that is used to control a 180 degree range of phase shift results in a resolution of 0.04 degrees (180 degrees/4096). The embodiment of FIG. 1 can also be used for those applications that do require a continuously variable phase. By using an analog voltage control circuit, instead of the digital microprocessor 124 and the D/A converter 122, the voltage can be continuously varied.

Figure 2:
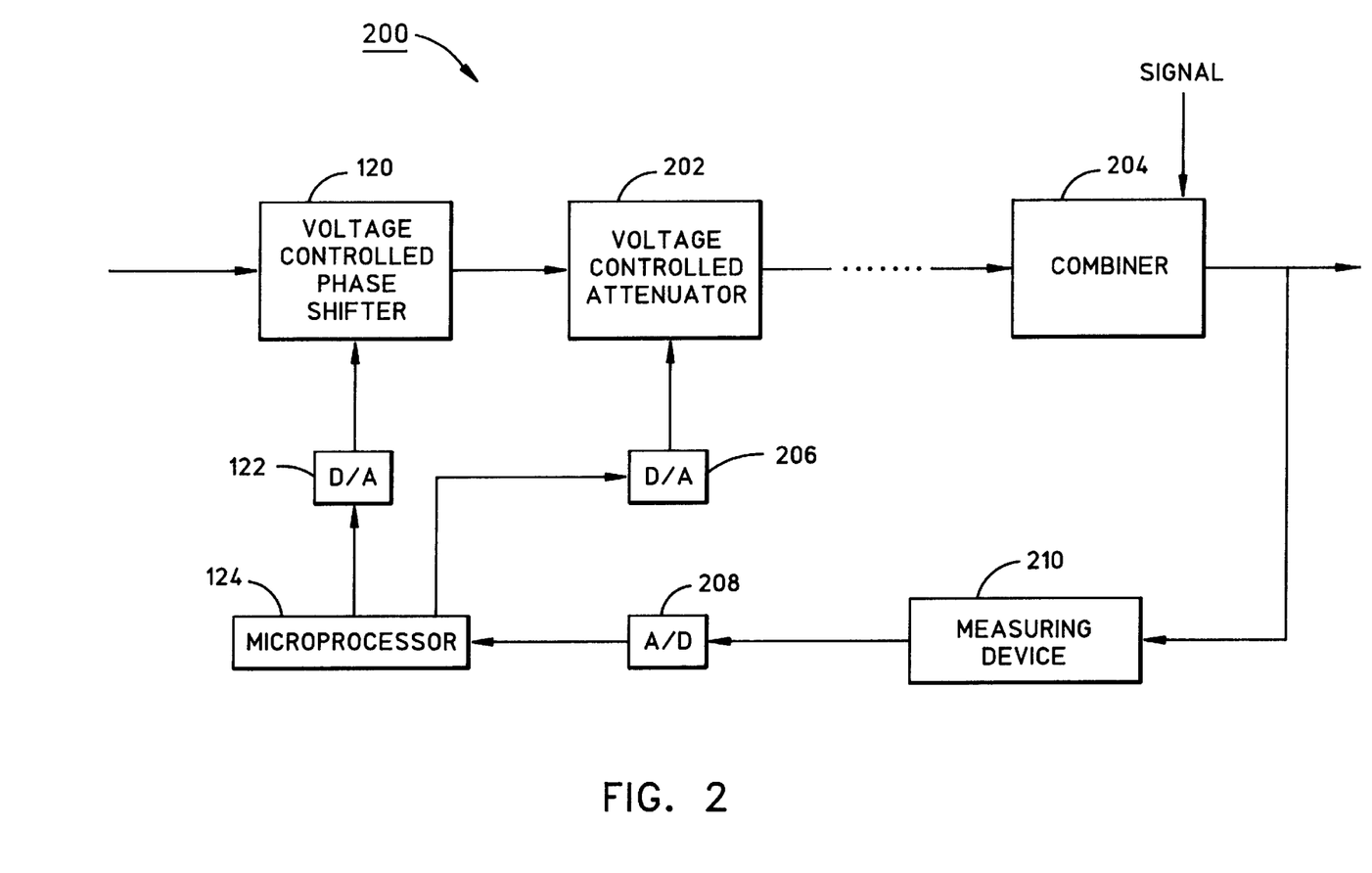
FIG. 2 is a block diagram of a generic system utilizing the phase shifter of FIG. 1.

FIG. 2 shows the phase shifter 120 in a larger circuit 200. This circuit 200 is typical of those applications, such as a feed-forward amplifier, that employ a phase shifter 120 and a gain controller 202 in order to remove an unwanted signal such as distortion. This removal is done by the combiner 204, which is commonly implemented with an adder, subtracter, or directional coupler, but other devices may also be used. The measuring device 210 is used, amongst other things, to quantify the performance of the phase and gain controllers and to translate the combined signal into some sort of metric that can be evaluated. Many methods of quantifying the performance exist, but two common methods are to measure the power in the combined signal, either the total power or the power in a particular frequency band, or to detect and count the number of errors in the received data. This information is then fed through the A/D converter 208 to the microprocessor 124, which uses it to optimize the phase shifter 120 and the gain controller 202, through D/A converters 122 and 206 respectively, in order to maximize the performance of the circuit 200. Depending on the complexity of the application, the optimization might be done without the use of a microprocessor, by using comparators and other standard logic.

Figure 3:
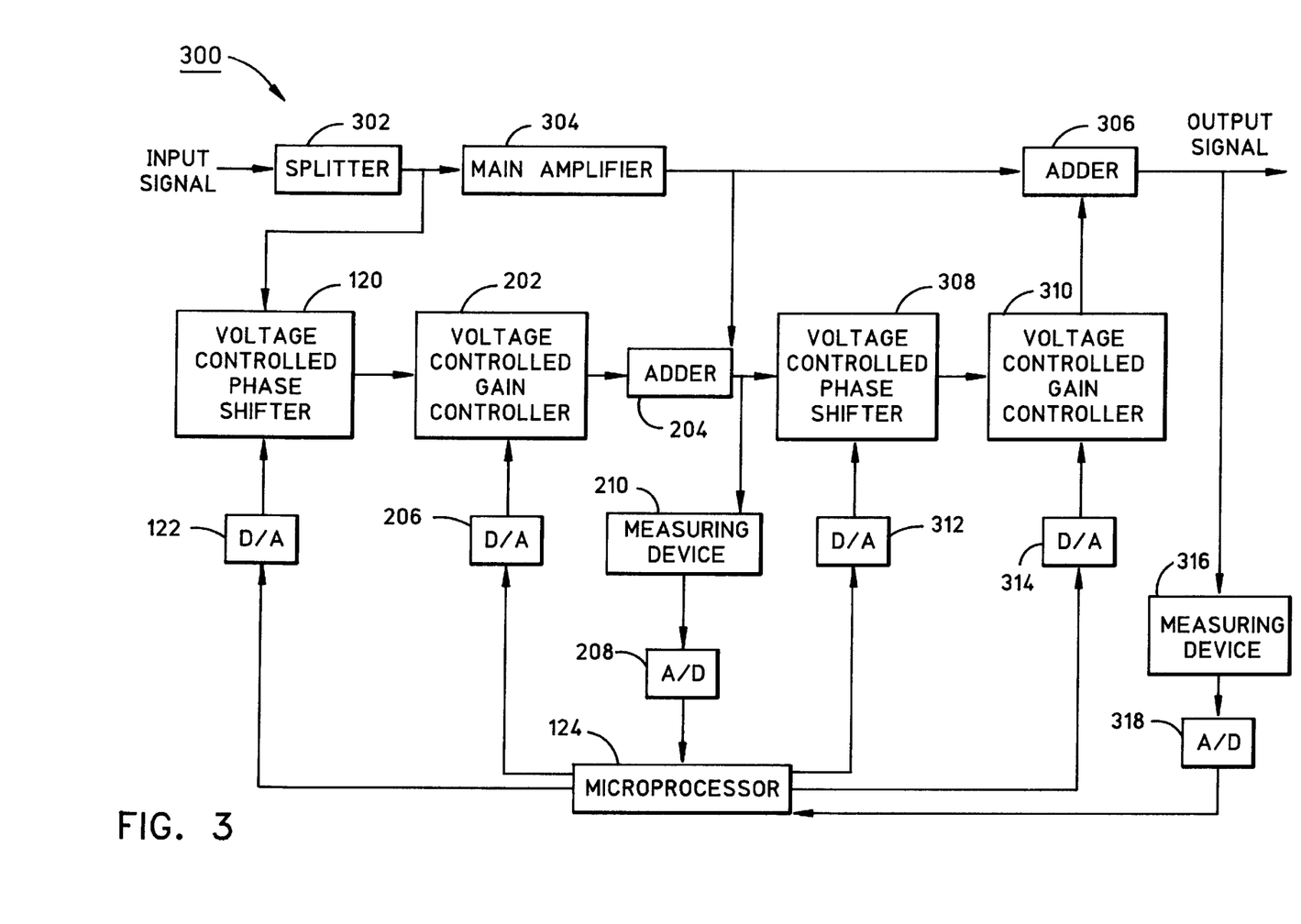
FIG. 3 is a block diagram of a feed-forward amplifier utilizing the phase shifter of FIG. 1.

FIG. 3 shows a feed-forward amplifier 300 which is built on the model of FIG. 2, essentially comprising two stages of that model. The feed-forward amplifier employs two phase shifters 120, 308 and their respective D/A converters 122, 312, two gain controllers 202, 310 and their respective D/A converters 206, 314, two combiners 204, 306 which are adders in this embodiment, and two measuring devices 210, 316 and their respective A/D converters 208, 318. Phase shifter 120 delays the input signal from the splitter 302 (capable of many implementations, including a generic splitter, a 3 dB hybrid, or a directional coupler) by 180 degrees so that adder 204 effectively subtracts the input signal from the output of the main amplifier 304. This results in the measuring device 210 receiving, ideally, only the distortion from the main amplifier 304. Thus, the performance of this first stage is maximized when the resulting power measured by measuring device 210 is minimized, indicating that all of the input signal has been removed. A similar function occurs with phase shifter 208 which shifts the distortion by 180 degrees, gain controller 310, and adder 306 which effectively subtracts the distortion from the output of the main amplifier. Again, the performance of this stage, as with the first, is maximized when the resulting power of the output signal is minimized, indicating that all of the distortion has been removed.

It is instructive to point out the transformation that each of the stages performs on the input variables received from the microprocessor. These variables are first transformed from a series of digital inputs into DC signals with specific voltage levels by each of the D/A converters 122, 206, 312, 314. Then, with the aid of the phase shifters 120, 308 and the gain controllers 202, 310, the voltage levels are used to transform the physical waveforms by changing either their phase or amplitude.

As the preceding discussion about feeding back some measure of the performance of the circuit indicates, the phase shifters 120, 308 and gain controllers 202, 310 of FIG. 3 will need to be optimized. This will need to be done at startup time, and it will need to be repeated whenever the optimal operating point changes. Myriad factors can cause the optimal operating point to change, but the most common are changing environmental conditions. This process of finding and tracking the optimal operating point can require a lot of computation and searching which consumes time and can interfere with performance.

Referring to FIG. 2, assuming that the D/A 122 has a 12-bit input, then an exhaustive search of all input values for the phase shifter 120 requires setting the phase shifter 120 to each of 4096 different values, measuring the performance of the circuit 200 for each input, and comparing the results to find the input with the best performance. Because the circuit 200 also comprises a gain controller, as is usually the case, the optimization must actually be done over 2 variables. Assuming that the gain controller's D/A 206 is also a 12-bit device, there are now 224 (4096×4096) different phase/ amplitude pairs of inputs that must be tested and compared. Performing the 224 measurements and the 2**24-1 comparisons would be prohibitive.

According to the present invention, there is proposed a quick initialization algorithm that requires far fewer measurements and comparisons. The algorithm relies on the fact that phase shifter does not affect the attenuation level of the signal, that is, that phase changes can be done independently of amplitude changes. In initializing a phase/amplitude controller, the amplitude controller must first be set to a particular amplitude and then the phase shifter can be varied. In this way, the algorithm knows exactly which phase and amplitude values it has tested. Only in this way, can the system be guaranteed to find the optimal operating point.

Additionally, this algorithm takes advantage of the facts that the error measurement which is performed by the measuring device (e.g. measuring device 210 in FIG. 2) has exactly one local minimum, and is symmetrical about this local minimum. In practice, the algorithm can be modified so that it is tolerant to aberrations from these assumptions about the shape of the error measurement curve, but the best performance will be obtained when these conditions are met. The algorithm requires a maximum of 576 measurements and 288 comparisons, as will be explained later, and even greater efficiencies can be obtained in typical cases.

The above analysis is for the two variable (and typical) case of initializing both the phase and the amplitude at the same time. For the one variable case of initializing only the phase shifter or the amplitude controller alone, however, the brute force mechanism requires 212 measurements and 212-1 comparisons, and the algorithm requires a maximum of 12 comparisons and 24 measurements. These numbers are helpful in understanding the basic operation of the algorithm because they reveal the fact that the algorithm operates logarithmically by repeatedly dividing the space of possible inputs by two. It is able to do this because of the symmetry of the error measurement, as a function of phase, and because there is exactly one local (and global) minimum. The algorithm would work equally well if the measurement involved needed to be maximized instead of minimized, as long as there was only one local maximum and the measurement was symmetrical about this point.

Figure 4:
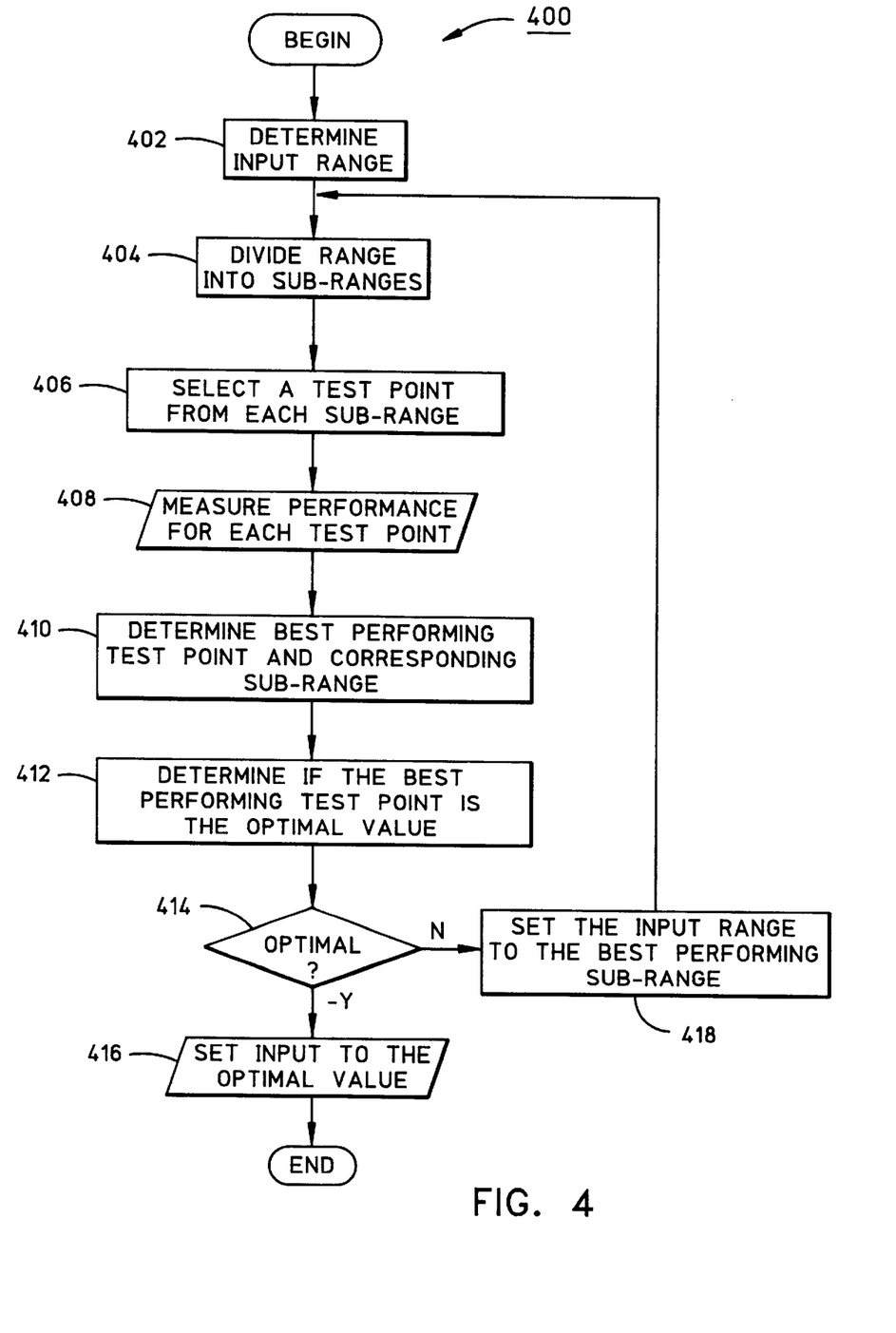
FIG. 4 is a flow chart of an initialization algorithm according to the present invention.

FIG. 4 contains a flow chart 400 of a generalized version of the initialization algorithm in which it is not tied to any particular application. The algorithm is described below for a general divide-by-two version, and the preferred embodiment, which applies the divide-by-two version to initializing both phase and amplitude, is discussed later. The first step in the algorithm is to determine the range of input values 402, regardless of whether it is a discrete space or a continuous space. This space is then divided 404 approximately in half, and one point is selected 406 from near the middle of each half. Then these two points are used as input into the phase shifter, the circuit performance is measured for each of them 408, and the better performing point is determined 410. This completes one iteration of the algorithm. The half of the range from which the better performing point came 418 is then divided 404 approximately in half, and two new test points are chosen 406 from near the middle of each new (and smaller) half. The circuit performance is then measured for each of these new test points 408 and the better performing point is determined 410. This process continues, with each iteration dividing the range of inputs 404 approximately in half, until the optimal point is determined 412, 414. When the optimal input is determined, the input is set accordingly 416.

In the case of a 12-bit discrete range, this process will identify the optimal point in 12 comparisons and 24 measurements. In the case of a continuous space it could theoretically take an infinite number of steps to identify the optimal point, so some sort of test must be devised to determine when to stop. Such a test could also be used with a discrete range to speed the optimization algorithm. Possible tests are unlimited, and some examples include basing the determination on the number of iterations already performed, the size of the remaining input range, the difference in performance between the test points in a given iteration, or the marginal gain in performance between the better performing test points in successive iterations.

The above tests are rather generic, and it is possible to tailor a test to a specific circuit and its behavior. First, historical information could be used to inform the test. For example, for a 12-bit discrete range used in the circuit of FIG. 3, the algorithm will typically arrive at a point with good performance within 5 or 6 comparisons, and the remaining 6 or 7 only provide minimal marginal gains. This can reduce the total number of computations and computation time by a factor of 2. Additionally, the algorithm can be modified to include some memory of previous optimal initialization points to speed the process. Second, information about the behavior of the curve in the vicinity of its minimum (or maximum) could be utilized in formulating a test. For example, in the case of a performance curve that has a range of adjacent (or continuous) points that all give essentially the same, and the optimal, performance, the algorithm can be adapted to compare the performance values for its test points and determine when it has arrived at this region of optimal performance. In this way, the algorithm will also require fewer iterations. If a test is used, the performance of the circuit may not be maximized by the algorithm, but we shall still speak of the performance as having been optimized. The optimization, in this sense, now taking into consideration the time and computing power required to continue the algorithm, and the expected performance increases.

In alternate embodiments, the performance need not meet the assumption of being symmetrical about the optimal point. The initialization algorithm can be adapted to the shape of the actual curve, and might choose not to select test points from the middle of each subregion, or might choose multiple test points from a given subregion. The algorithm might also select multiple points from each subregion on the first iteration to ascertain the general shape of the curve, and then use this information to be more efficient in subsequent iterations.

The performance curve need not necessarily meet the other assumption that it have a single local minimum (or maximum). The algorithm would have to be adapted, but this could be done in a number of ways and would not alter the fundamental nature of the algorithm which is a logarithmic method of dividing the input range. Some possible adaptations include testing points throughout the space, or repeating the algorithm with a different starting point.

Alternate embodiments may also use a different logarithmic base to implement the algorithm. That is, instead of dividing the space into two regions in each iteration, the algorithm may divide the range into three or more regions on one or more of the iterations. Additionally, it is not necessary to divide the range into equal-sized subregions. For instance, memory may be utilized to focus on certain smaller regions because of their propensity to contain the optimal point, and this may allow the system to converge to an optimal value in a smaller number of iterations.

As stated earlier, the preferred embodiment of the initialization algorithm is a two-variable version that initializes both phase and amplitude, which can be used to initialize the circuits in FIG. 2 and FIG. 3. Referring to FIG. 4, after the algorithm has selected a test point for the amplitude 406, it needs to measure the performance of the circuit 408. To perform this step for a phase/amplitude controller, the algorithm needs to search for the optimal value of the phase for that fixed value of amplitude. Note that the amplitude must be selected first, because only the phase shifter can move one variable independently of the other.

The optimal phase is found by executing the initialization algorithm while keeping the amplitude fixed. Thus, the algorithm is nested to simultaneously optimize multiple variables. For the fixed value of the amplitude, the initialization algorithm is executed to search for the optimal phase. The nested algorithm terminates by returning the performance associated with this phase and amplitude pair, as well as the pair itself, and the first, or parent, algorithm continues to step 410. In the multiple variable case, all of the same comments apply regarding alternate embodiments, approximations, adaptations of the algorithm, etc. Additionally, any resulting efficiencies are multiplied.

As mentioned earlier, the maximum number of operations for the two variable case is 288 comparisons and 576 measurements. This holds for the case of the two variable circuit 200 in FIG. 2 with 12-bit D/A converters 122, 206. The initialization algorithm will compare the performance of 12 pairs of amplitude test points. Each of these amplitude test points will be optimized for phase, which will require the comparison of the performance of 12 pairs of phase test points. Each phase test point will require a measurement of the performance of the circuit 200.

A variety of factors can affect the optimal operating point, so having found the optimal operating point for the phase/amplitude controller, the system now needs a mechanism for tracking the optimal operating point as it moves. The optimal operating point will naturally depend on the input, such as fluctuating input power or frequency, but even with a constant input it will vary as the components age and the environmental conditions change. Typical search algorithms and the initialization algorithm described above are not well suited to perform this tracking function, because they significantly change the operating point during the search and this may markedly deteriorate performance. For applications involving communication systems, this may cause a loss of data or of a communication link.

The typical method of updating a phase/amplitude controller is to compare the performance to an external reference, and to adjust the phase or attenuation setting accordingly. According to the present invention, there is proposed a quick update algorithm that tracks the optimal operating point by means of a floating reference. The algorithm compares the performance of the circuit to the performance obtainable at nearby settings of phase and attenuation. There is thus no need for an absolute reference. Further, the "floating reference," or relative comparison, incorporates changes in environmental conditions because it is never trying to achieve a given value (the external reference), but rather it is always trying to achieve a better value.

Figure 5:
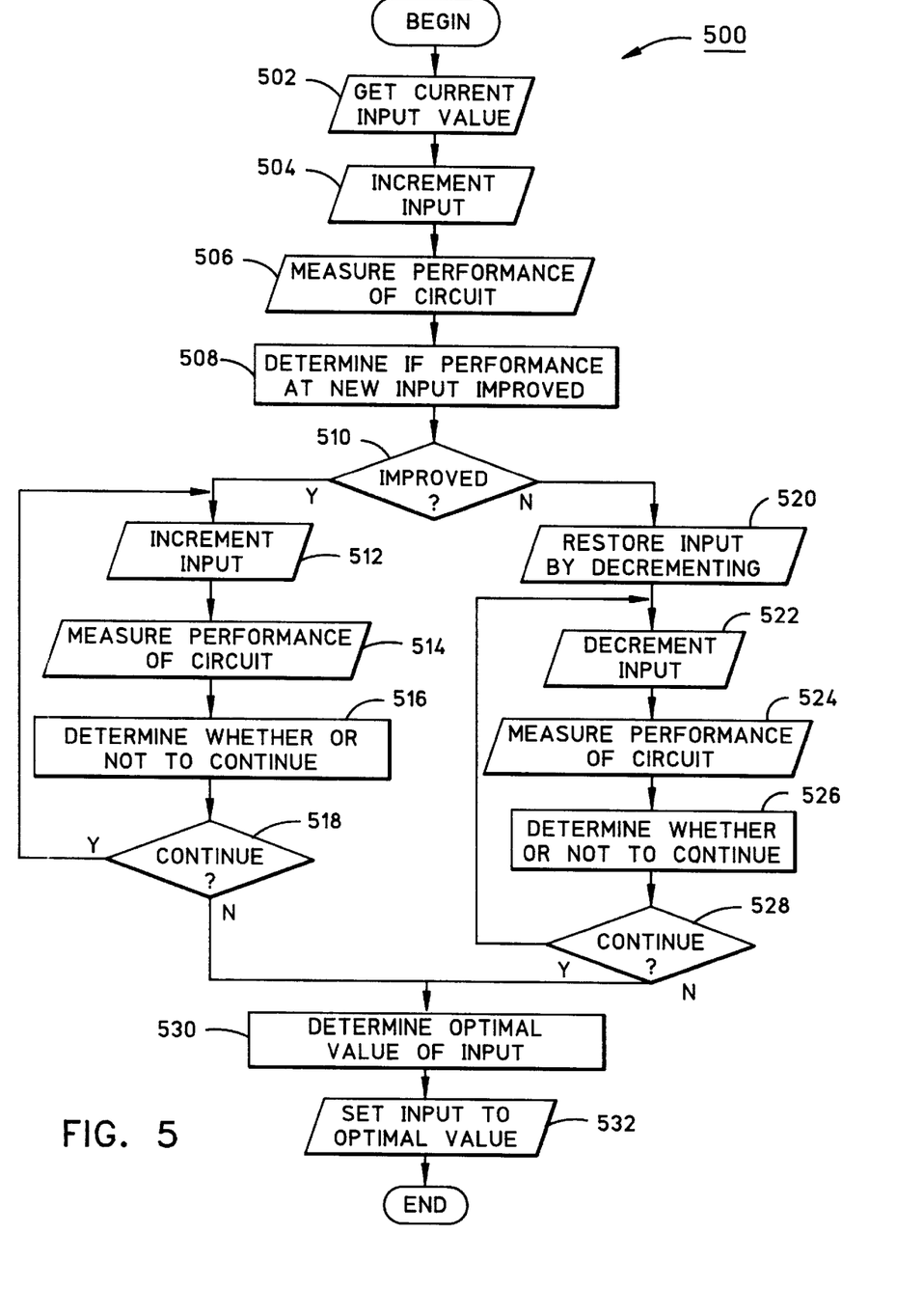
FIG. 5 is a flow chart of an update algorithm according to the present invention.

FIG. 5 is a flow chart describing a generalized version of the update algorithm. This flow chart will be used to describe the algorithm generally, and then to describe the preferred embodiment which is the application of the algorithm to a phase/amplitude controller. Referring to FIG. 5, the update algorithm 500 begins by incrementing the input by one step 502, 504, and then measuring the performance 506. This essentially completes one iteration of the update algorithm. If the performance has increased, the update algorithm increments the input one more step 508–512 and again measures the performance 514. The update algorithm continues performing these iterations until the performance fails to improve over that obtained at the previous input. When the decision is made not to perform another iteration 516, 518 the algorithm then determines what the optimal value is 530 and sets the input to this value 532. The algorithm will actually pass up the optimal point by one iteration because it must wait to see what the performance is at the next point in order to make that determination. In this case, the update algorithm will then have to move the input back to the previous input (i.e. the input that produced the best performance).

If the first increment of the input failed to increase the performance 508, then the update algorithm restores the original input 520 and begins decrementing the input 522 to find the optimal point. The update algorithm follows the same sequence of steps 522–528 as it would if it were incrementing the input 512–518 until the optimal input is determined 526–530, and then sets the input to this optimal value 532. The update algorithm thus takes advantage of the fact that the performance can only improve in one direction, which follows from the fact that there is only one minimum (or maximum).

The update algorithm could just as easily be implemented by starting the search by decrementing, instead of incrementing. The choice is arbitrary, unless the environment changes in a known fashion. For example, if a system is always started cold and always turned off hot, the direction of movement of the optimal point should always follow the same pattern, and the update algorithm could be written to follow this pattern.

In alternate embodiments, if a quicker algorithm is desired, then the determinations in 516 or 526 could be based on some other threshold, and the update algorithm could stop before it finds the operating point with the best performance. In such cases, the determination of the optimal point 530 is already done in the earlier determination. These alternate thresholds or tests may employ a comparison of the marginal gain from each successive point, simply stop searching after a fixed number of points each time the update algorithm is executed, or use any of the other approximations, adaptations, etc. suggested for the initialization algorithm.

The foregoing description of the update algorithm can also be adapted to continuous input ranges. This requires some mechanism for choosing how far to increment or decrement the input value in each iteration. The simplest is to select a step size for a given application and circuit. More complex algorithms may choose to change the step size at certain points in the algorithm, or based on the performance, or according to some other criteria.

Expanding the update algorithm to multiple variables is analogous to the situation with the initialization algorithm and can be illustrated by describing the preferred embodiment. In both algorithms, one variable is changed and then the system is optimized across the second variable. It is important, therefore, in both algorithms that the second variable be moved independently of the first. This is accomplished in the preferred embodiment by first changing the amplitude of the phase/amplitude controller, and then changing the phase. If the phase were set first, and the amplitude were changed afterward, then the phase would also be changed when the amplitude was changed and the algorithm would not know which phase/amplitude pairs had been tested, and it is possible that the optimal point would have been missed.

Once the amplitude has been changed by one step size, in either step 504, 512, or 522, the next step of measuring the performance 506, 514, or 524 entails measuring the performance of the circuit and, using that performance value as the floating reference, executing the algorithm again for the phase variable, thereby nesting the algorithm. The phase is incremented and/or decremented until the optimal value for that fixed amplitude is determined 504–530 (of the nested algorithm), the nested algorithm terminates and returns this performance value and phase/amplitude pair to either step 506, 514, or 524, and the performance associated with this phase/amplitude pair is compared to the performance of the original operating point in either step 508, 516, or 526 respectively. The amplitude is then changed again, if necessary, and the process for the phase is repeated, that is, the algorithm is nested again.

An important feature of the update algorithm is that it never causes the performance of the circuit to deteriorate by more than the marginal performance change associated with a change of one step of the amplitude and the phase (plus whatever change in phase the amplitude change creates). This is so because if the performance goes down, then the update algorithm turns around and starts looking in the other direction. Thus, the circuit should be able to continue to operate without any noticeable disturbance from the update algorithm. This is important if the circuit is part of a communications system, or some other system where it is important that operation not be impaired or interrupted.

The number of operations required in the update algorithm is largely dependent on how far the optimal operating point is allowed to drift, and this can be controlled by the frequency with which the update algorithm is executed. Depending on the rate of change of the environmental conditions and the sensitivity of the circuit to these changes, a frequency of update can be devised that will ensure that the circuit's performance never deteriorates more than is tolerable. In this way, the update algorithm can allow a circuit's performance to be relatively independent of environmental conditions.

The update algorithm can also be used to allow the circuit to be powered up and operational more quickly by allowing the initialization algorithm to stop before it finds the operating point with the best performance. If the update algorithm is executed frequently enough, it can finish the job of the initialization algorithm and find the operating point with the best performance. In this way, the initialization algorithm merely needs to find an operating point with acceptable performance.

It is instructive to point out the role that these algorithms play in the transformations described earlier. The algorithms produce an input to the circuit which is determined by measuring the transformation that this input produces in a physical waveform. The circuit itself is, therefore, a necessary part of the actual execution of the algorithms. In the feed-forward amplifier of FIG. 3, the algorithms' manipulation of the phase and amplitude causes the removal of the input signal from the output of adder 204, and the removal of the distortion from the output of adder 306, resulting in a distortion-free amplified signal.

Both the initialization algorithm and the update algorithm described above can be implemented in software (e.g. in C language), in hardware, or by a combination of both. Moreover, this functionality may be embodied in computer readable media (such as 3.5 inch diskettes) to be used in programming an information-processing apparatus to perform in accordance with the invention. This functionality may also be embodied in computer readable media such as a transmitted waveform to be used in transmitting the information or functionality.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for providing an output signal with a variable phase delay relative to an input signal, the method comprising the following steps:

selecting an input value to a D/A converter to vary a DC bias voltage of a microstrip element, the element being arranged in a four port 3 dB hybrid structure electrically coupled to varactor diodes on ports 3 and 4 and having a DC-decoupled input on port 1 and a DC-decoupled output on port 2, to provide an output signal at the output with a variable phase delay relative to an input signal at the input; and inputting into the D/A converter the selected input value to vary the DC bias voltage of the microstrip element.

2. The method of claim 1, wherein the input value to the D/A converter is selected from a predetermined collection of input values corresponding to predetermined variations in phase delay relative to the input signal.

3. A computer readable medium containing computer program instructions for a controller for:

selecting an input value to a D/A converter to vary a DC bias voltage of a microstrip element, the element being arranged in a four port 3 dB hybrid structure electrically coupled to varactor diodes on ports 3 and 4 and having a DC-decoupled input on port 1 and a DC-decoupled output on port 2, to provide an output signal at the output with a variable phase delay relative to an input signal at the input; and inputting into the D/A converter the selected input value to vary the DC bias voltage of the microstrip element.

4. The computer readable medium of claim 3, further including computer instructions for:

selecting the input value to the D/A converter from a predetermined collection of input values corresponding to predetermined variations in phase delay relative to the input signal.

5. A phase shifting device comprising:

first and second varactor diodes;

a microstrip element, the element being arranged in a four port 3 dB hybrid structure electrically coupled to the first varactor diode on port 3 and to the second varactor diode on port 4, and having a DC-decoupled input on port 1 and a DC-decoupled output on port 2, to provide an output signal at the output with a variable phase delay relative to an input signal at the input;

a D/A converter electrically coupled to port 2 for providing a DC bias voltage to the microstrip element; and a controller electrically coupled to the D/A converter to provide an input value to the D/A converter to vary a DC bias voltage of the element to thereby vary a phase delay of the output signal relative to the input signal.

6. The phase shifting device of claim 5, wherein:

the first varactor diode and the second varactor diode have substantially the same capacitance change characteristics, as a function of reverse biasing voltage, over a sufficiently large range of voltage to provide constant-attenuation phase shifts over a phase range of +/− 180 degrees.

7. The phase shifting device of claim 5, wherein the controller includes a memory for storing a predetermined collection of input values corresponding to predetermined variations in phase delay relative to the input signal, and wherein the controller selects the input value to the D/A converter from the predetermined collection of input values in the memory.

8. A phase shifting device for shifting the phase of an input signal, the phase shifting device comprising:

a microstrip element arranged in a four port 3 dB hybrid structure and having a DC-decoupled input on port 1 and a DC-decoupled output on port 2 to provide an output signal at the output with a variable phase delay relative to an input signal at the input;

a first diode operated in the reverse-biased mode having continuously variable capacitance, wherein the first diode is coupled to port 3 of the 3 dB hybrid structure;

a second diode operated in the reverse-biased mode having continuously variable capacitance, wherein the second diode is coupled to port 4 of the 3 dB hybrid structure, and wherein the first diode and the second diode have substantially the same capacitance change characteristics, as a function of reverse biasing voltage, over a sufficiently large range of voltage to provide constant-attenuation phase shifts over a phase range of +/− 180 degrees;

a D/A converter electrically coupled to port 2 of the 3 dB hybrid structure for providing a DC bias voltage to the microstrip element; and a controller electrically coupled to the D/A converter to provide an input value to the D/A converter to vary a DC bias voltage of the element to thereby vary a phase delay of the output signal relative to the input signal.

* * * * *